United States Patent
Shah et al.

(10) Patent No.: US 10,459,847 B1
(45) Date of Patent: Oct. 29, 2019

(54) NON-VOLATILE MEMORY DEVICE APPLICATION PROGRAMMING INTERFACE

(71) Applicant: GOOGLE INC., Mountain View, CA (US)

(72) Inventors: Monish Shah, Dublin, CA (US); Albert Thomas Borchers, Aptos, CA (US); Joel Dylan Coburn, Sunnyvale, CA (US); Benjamin Charles Serebrin, Sunnyvale, CA (US)

(73) Assignee: GOOGLE LLC, Mountain View, CA (US)

( * ) Notice: Subject to any disclaimer, the term of this patent is extended or adjusted under 35 U.S.C. 154(b) by 282 days.

(21) Appl. No.: 14/789,535

(22) Filed: Jul. 1, 2015

(51) Int. Cl.
*G06F 13/36* (2006.01)
*G06F 12/1081* (2016.01)
*G06F 12/02* (2006.01)
*G11C 7/10* (2006.01)

(52) U.S. Cl.
CPC ...... *G06F 12/1081* (2013.01); *G06F 12/0246* (2013.01); *G11C 7/1072* (2013.01); *G06F 2212/2532* (2013.01); *G06F 2212/7202* (2013.01)

(58) Field of Classification Search
CPC .......... G06F 12/1081; G06F 12/0246; G11C 7/1072
USPC ......................................................... 710/308
See application file for complete search history.

(56) References Cited

U.S. PATENT DOCUMENTS

| | | | | |
|---|---|---|---|---|
| 6,065,139 A | * | 5/2000 | Mehta | G06F 11/0757 714/2 |
| 6,745,283 B1 | * | 6/2004 | Dang | G06F 3/0613 711/113 |
| 7,293,191 B1 | | 11/2007 | Arumugham et al. | |
| 8,719,520 B1 | | 5/2014 | Uppu et al. | |
| 8,997,210 B1 | * | 3/2015 | Kaplan | G06F 9/30145 710/305 |
| 9,170,939 B1 | * | 10/2015 | Jones | G06F 12/0246 |
| 9,250,999 B1 | | 2/2016 | Barroso | |
| 2003/0005354 A1 | | 1/2003 | Kalman et al. | |
| 2005/0038958 A1 | | 2/2005 | Jadon et al. | |
| 2005/0039090 A1 | | 2/2005 | Jadon et al. | |

(Continued)

OTHER PUBLICATIONS

Notice of Allowance for U.S. Appl. No. 14/083,855, dated Sep. 30, 2015, 7 pages.

(Continued)

*Primary Examiner* — Chun Kuan Lee
(74) *Attorney, Agent, or Firm* — Brake Hughes Bellermann LLP

(57) ABSTRACT

A method includes deploying non-volatile random access memory (NVRAM) coupled to a processor or central processing unit (CPU) core of a computing device as a peripheral device via an input/output (I/O) bus, and providing a NVRAM application programming interface (API) for the CPU core to conduct NVRAM read and write operations. Providing the NVRAM API includes allocating a single memory buffer per command to hold data transferred to or from the NVRAM. The method includes configuring the processor in conjunction with the NVRAM API to set up command queues inside in the host Memory Mapped Input Output (MMIO) space.

42 Claims, 7 Drawing Sheets

(56) References Cited

U.S. PATENT DOCUMENTS

| | | | |
|---|---|---|---|
| 2005/0060441 A1* | 3/2005 | Schmisseur | G06F 13/28 |
| | | | 710/22 |
| 2007/0038593 A1 | 2/2007 | Critchley et al. | |
| 2008/0082750 A1 | 4/2008 | Okin et al. | |
| 2008/0151724 A1 | 6/2008 | Anderson et al. | |
| 2009/0049251 A1 | 2/2009 | Bartfai et al. | |
| 2009/0182919 A1* | 7/2009 | Chang | G06F 13/4291 |
| | | | 710/106 |
| 2009/0313617 A1 | 12/2009 | Hung et al. | |
| 2011/0202724 A1* | 8/2011 | Kegel | G06F 12/1027 |
| | | | 711/118 |
| 2012/0151157 A1* | 6/2012 | Sela | G06F 3/0607 |
| | | | 711/154 |
| 2012/0278528 A1 | 11/2012 | Galbraith et al. | |
| 2013/0290759 A1 | 10/2013 | Kumar et al. | |
| 2013/0339572 A1 | 12/2013 | Fanning et al. | |
| 2014/0013045 A1 | 1/2014 | Crossland et al. | |
| 2014/0173017 A1 | 6/2014 | Takagi et al. | |
| 2014/0201314 A1 | 7/2014 | Borkenhagen et al. | |
| 2014/0281152 A1 | 9/2014 | Karamcheti et al. | |
| 2014/0304469 A1 | 10/2014 | Wu et al. | |
| 2015/0082081 A1 | 3/2015 | Akirav et al. | |
| 2015/0356036 A1* | 12/2015 | Feehrer | G06F 13/24 |
| | | | 710/263 |
| 2016/0292100 A1* | 10/2016 | Olcay | G06F 13/28 |

OTHER PUBLICATIONS

Response to Office Action for U.S. Appl. No. 14/083,855, 13 pages.
Non-Final Office Action from U.S. Appl. No. 14/083,855, dated Apr. 28, 2015, 19 pages.

* cited by examiner

600

610
Providing NVRAM as memory modules (e.g., dual-in-line memory modules (DIMMs)) coupled to the CPU core of the computing device as a peripheral device via an I/O bus

620
Providing a NVRAM application programming interface (API) for the CPU core to conduct NVRAM read and write operations

621
Allocating a single memory buffer, for example, in an I/O bridge or controller portion of the processor or CPU core, to hold data transferred to or from the NVRAM via the API

622
Limiting the bit-size of commands for read or write operations on the NVRAM via the API

623
Limiting the bit-size of commands to the size of a single machine instruction (e.g., 64 bits, etc.) that can be issued by the CPU

624
Providing a command structure that includes an address-bits field and an information-bits field

625
Amplifying the information content of a bit-size limited command by using the information bits carried in the information-bits field to link to one or more pre-initialized registers, which store additional information

626
Providing a bit in the command structure to indicate that the NVRAM should provide a completion indication to the host

FIG. 6

NON-VOLATILE MEMORY DEVICE APPLICATION PROGRAMMING INTERFACE

TECHNICAL FIELD

This disclosure generally relates to computing devices (e.g., servers, desktop computers, laptops, smartphones, etc.). In particular, the disclosure relates to management of memory in the computing devices.

BACKGROUND

One of the most-demanded resources in computing devices (other than the CPU) is system memory. In computing, memory refers to the physical devices used to store programs or data on a temporary or permanent basis for use in a computer or other digital electronic device. The term primary or main memory is used for semiconductor memory devices (i.e. dynamic random access memory (DRAM) and static random access memory (SRAM)), which function at high speed. The term secondary memory is used for memory devices such as hard disk drives (HDD) and solid state drives (SSD), which may be relatively slow to access but offer higher memory capacity than conventional random access memory (e.g., DRAM).

DRAM and SRAM are both volatile memory, i.e. they can maintain data only for as long as power is applied. This may be contrasted with non-volatile random access memory (NVRAM) that retains its information even when power is turned off.

Newer semiconductor memory technologies (e.g., phase-change memory, magneto-resistive memory (or memristors), spin-torque memory, etc.) have increased chip capacity so that these new types of memory ("new memories") can now compete with conventional secondary memory (such as HDDs and SSDs) in offering higher memory capacity and also in slashing an access penalty for solid state storage (e.g., compared to SSDs). The new memories may be as fast as conventional DRAM for processor load or read operations. However, the new memories may still be significantly slower (~10×) than conventional DRAM for processor store or write operations (both in latency and throughput). For convenience in description herein, such new memories may be referred to hereinafter as "non-volatile random access memory (NVRAM)".

Consideration is now being given to the use of NVRAM in memory arrangements that are coupled to a processor or processor unit in a computing device.

SUMMARY

A computing device includes a processor, which has one or more central processing units (CPUs). The CPUs are coupled to a main memory arrangement on a memory bus via a memory controller. The processor further includes an input/output bridge or controller coupled to one or more peripheral devices on an I/O bus.

Systems and methods for using non-volatile random access memory (NVRAM) in computing device are described herein.

In a general aspect, a non-volatile random access memory (NVRAM) is disposed as a peripheral device on the input/output (I/O) bus. The NVRAM includes a NVRAM controller. A NVRAM application programming interface (API) is implemented for the one or more CPUs to conduct NVRAM read and write operations over the I/O bus.

In one aspect, the NVRAM API is configured to use a single memory buffer, for each read or write command issued by the one or more CPUs, to hold data transferred to or from the NVRAM.

In another aspect, the one or more CPUs in conjunction with the NVRAM API are configured to set up command queues inside a reserved area in the computing device's main memory mapped I/O (MMIO) space with each command write in the MMIO space implicitly notifying the NVRAM controller that there is a command to execute.

The details of one or more implementations are set forth in the accompanying drawings and the description below. Other features will be apparent from the description and drawings, and from the claims.

BRIEF DESCRIPTION OF THE DRAWINGS

FIG. 6 is a flowchart illustration of an example method for deploying and managing NVRAM coupled to a processor or CPU core of a computing device, in accordance with the principles of the disclosure herein.

Like reference symbols in the various drawings indicate like elements.

DETAILED DESCRIPTION

In a standard memory arrangement or architecture for a computer, a processor or processors in a central processor unit (CPU) core of the computer may access primary or system memory over a memory bus (e.g., a standard DRAM memory bus). DRAM (including various varieties of DRAM such as DDR, DDR2, DDR3, etc.) may be deployed in the primary or system memory as memory modules (e.g., dual in-line memory modules (DIMMs)) on the memory bus. The CPU core may have a load-store unit that loads data from memory or stores it back to memory from buffer registers. A memory controller may control the interactions (e.g., read/write operations) between the CPU and the DRAM modules on the DRAM memory bus. Further, in some implementations of the standard memory arrangement or architecture for the computer, the CPU and memory may be coupled via an I/O bus (e.g., PCI or PCI-express bus) to peripheral components or devices (e.g., disk drives, printers, network cards, etc.) of the computer. The peripheral components or devices may access memory over I/O bus. The I/O bus speeds may be slower than the DRAM memory bus speeds.

NVRAM may be deployed as memory modules (e.g., dual-in-line memory modules (DIMMs)) in a memory arrangement coupled to a CPU core of a computer via an I/O bus, in accordance with the principles of the disclosure herein. The I/O bus may be coupled to and or be in addition to a standard memory bus (e.g., a DRAM memory bus), which may, for example, host DRAM DIMMs. However, NVRAM store (or write) speeds may be slower than standard DRAM store speeds. NVRAM store operations may have latencies which, for example, can be about 10x longer than standard DRAM store latencies. It may be expected that the slower NVRAM store speeds would be incompatible with conventional memory controller logic and CPU load/store units, which are designed for DRAM operations. By keeping regions of NVRAM address space busy or tied up for long durations, the slower NVRAM store operations may also interfere with read (or load) operations of the conventional memory controller logic and CPU load/store units in the computer.

In accordance with the principles of the present disclosure, systems and methods are provided herein for integrating use of NVRAM in computer memory arrangements and managing the effect of the asymmetrical NVRAM load and store access times on system performance.

Figure 1:
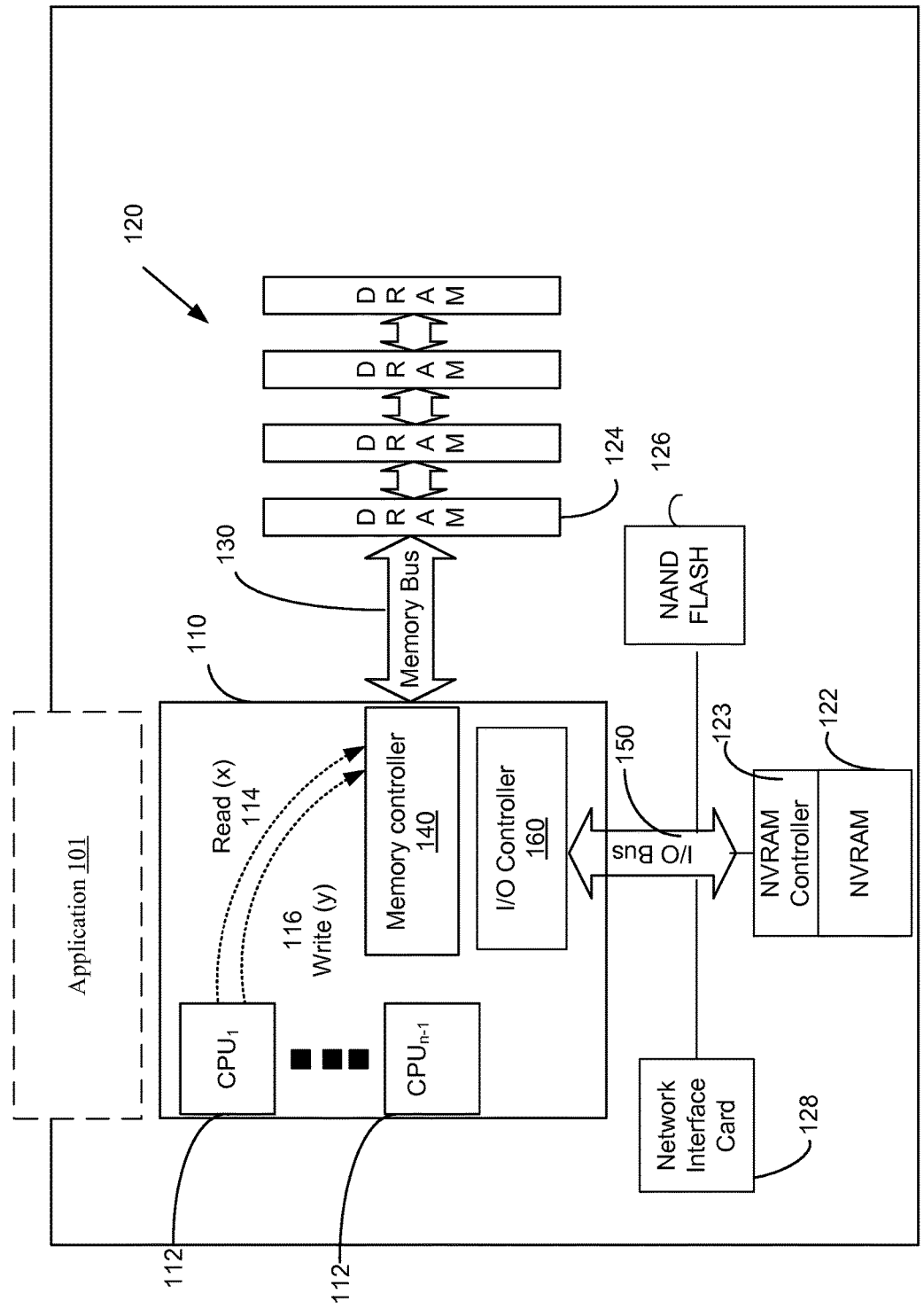
FIG. 1 is a schematic block diagram illustration of a computing device including a memory arrangement, which involves use of NVRAM, in accordance with the principles of the disclosure herein.

FIG. 1 shows an example system or computing device 100 including a memory arrangement 120, which further involves use of NVRAM, in accordance with the principles of the disclosure herein. Computing device 100 may, for example, run software (e.g., application 101), which includes commands to read data from, or write data to, the NVRAM.

Computing device 100 may, for example, include a processor 110 coupled to memory arrangement 120 via a memory bus 130. Processor 110 may include one or more CPUs 112, which may be arranged on a processor bus (not shown). Processor 110 may also include a memory controller 140 for memory bus 130, and an I/O controller 160 for an I/O bus 150 (e.g., a PCI or PCIe bus). I/O bus 150, which may branch off memory bus 130, may operate at a speed which is slower than the speed of memory bus 130. I/O bus 150 may be configured to connect processor 110 and memory arrangement 120 to peripheral components (e.g., printers, network interface cards, NAND flash, SSD, etc.) of computing device 100. In the example shown in FIG. 1, I/O bus 150 may, for example, support connections to a network interface card 128, a NAND flash/SSD 126 and other peripheral devices. Further, in an example implementation relevant to the present discussion, I/O bus 150 may be configured to connect processor 110 to a NVRAM device deployed as a peripheral device. The NVRAM device (e.g., NVRAM 122) may have or be coupled to its own device controller (e.g., NVRAM device controller 123). NVRAM device 122 and NVRAM device controller 123 may, for example, be mounted on a PCI card (not shown) for attaching hardware devices in a computer via I/O bus 150.

In computing device 100/memory arrangement 120, memory bus 130 may, for example, be a standard DRAM memory bus, which may, for example, host DRAM DIMMs 124. Further, processor 110, CPUs 112, memory controller 140, I/O controller 160 and I/O bus 150 may have conventional or traditional designs suited for computer architectures that traditionally deploy, for example, only DRAM and conventional or traditional peripheral components (including conventional or traditional memory elements such as NAND flash or SSD 126). I/O controller 160 and I/O bus 150 may be configured to access the peripheral components (e.g., printers, network interface cards, NAND flash, SSD, etc.) of computing device 100 independently of CPU 112. In example system or computing device 100, which further involves use of NVRAM, I/O bus 150 may be configured to connect processor 110 to NVRAM device controller 123 deployed as a peripheral device which in turn connects to and manages NVRAM 122.

Processor 110 may be configured so that read operations (e.g., "read x" 114) or write operations (e.g., "write y" 116) on the peripheral devices initiated by CPU 112 are performed through normal processor loads (e.g., load/store units) and over I/O bus 150 in the same manner DRAM read or write operations (e.g., direct memory access operations) are conducted by CPU 112 directly over memory bus 130 via memory controller 140. However, processor 110 may be further configured so that the slower peripheral devices write or store operations by CPU 112 via memory controller 140 are additionally routed through I/O bus 150/I/O controller 160. I/O controller 160 may control all I/O devices connected via I/O bus 150, including the NVRAM device. I/O controller 160 may also be capable of interacting with memory controller 140 and converting CPU loads and stores into loads and stores over I/O bus 150 which serve as commands and data for the I/O devices in general and NVRAM device controller 123 in particular. NVRAM device controller 123 may maintain and execute the commands directed to NVRAM 122 and return completion indications.

In an example implementation of computing device 100 or processor 110, I/O controller 160 may, for example, be an application-specific integrated circuit (ASIC) or a field programmable gate array (FPGA) logic chip, which has local buffering and at least one Direct Memory Access (DMA) engine or controller. The DMA engine may be the same or similar to those found, for example, on common computer I/O peripherals (e.g., disk drive controllers, graphics cards, network cards and sound cards). The DMA engine in I/O controller 160 may be configured, for example, to generate addresses and initiate memory write cycles. Further, the DMA engine in I/O controller 160 may maintain one or more buffer registers to which data can be written by CPU 112.

A traditional interface (not shown) between I/O controller 160 and a peripheral device (e.g., NAND flash 126) may involve building a queue of commands in the main memory of the host computer (e.g., computing device 100) and then notifying I/O controller 160 (acting, for example, as the NAND flash controller) that commands are ready for processing. I/O controller 160 may fetch the commands from main memory via DMA and then operate or execute the commands. A NAND flash command typically may include a scatter-gather list of memory buffers. In case of a read command (e.g., "read x" 114), the scatter-gather list of memory buffers may receive data read from NAND flash 126. Conversely, in case of a write or store command (e.g., "write y" 116), data from the scatter-gather list of memory buffers may be written to NAND flash 126.

A similar traditional interface between I/O controller 160 and the NVRAM device may be used by computing device 100 for read and write operations on NVRAM 122 as a peripheral device. However, such use may result in inefficient use of CPU processes and resources, for example, because of the incompatibility of access speeds to the memory buffers in main memory and the speed of I/O bus 150 to NVRAM 122.

Figure 2:
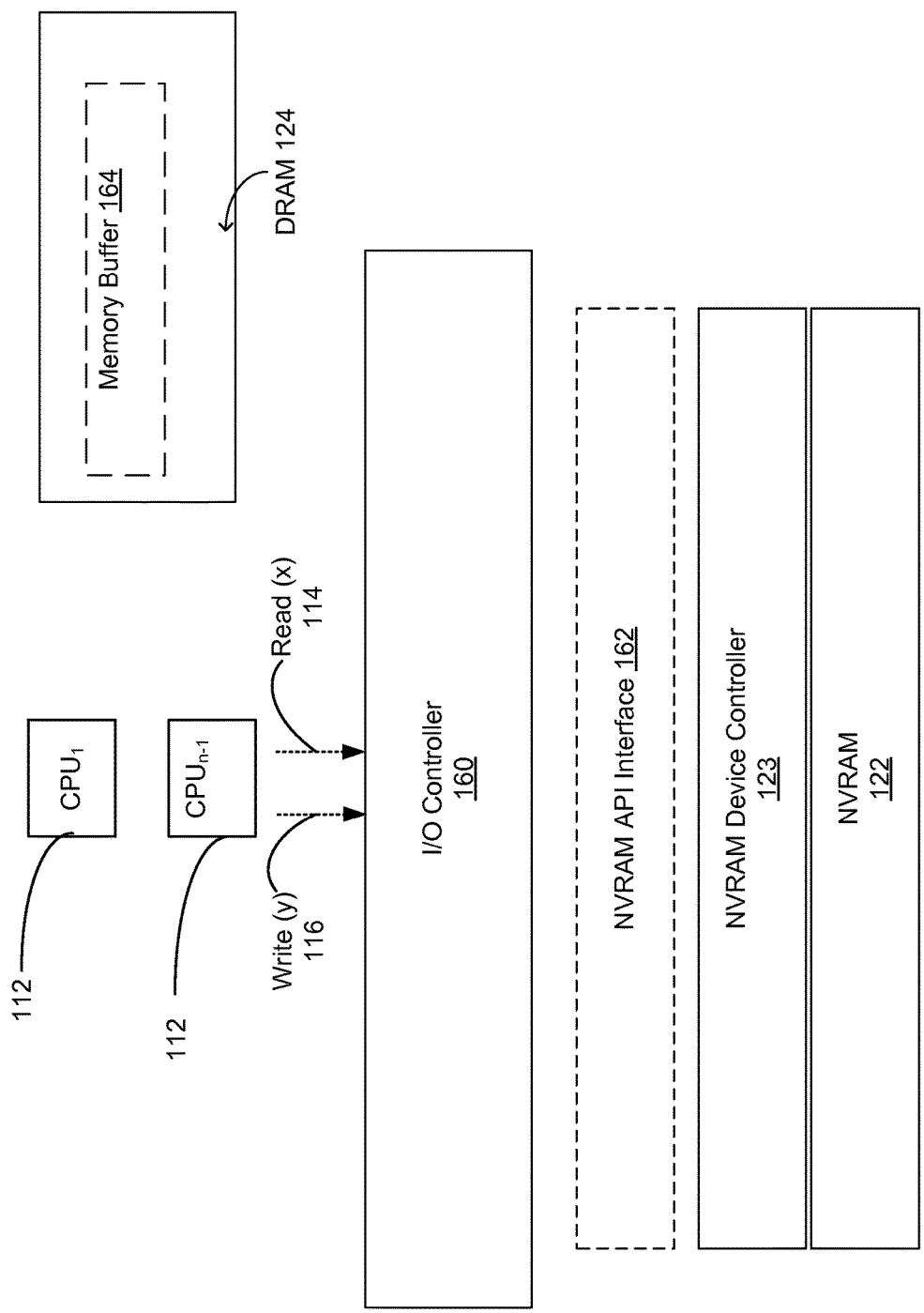
FIG. 2 is a schematic block diagram illustration of the use of an NVRAM application programming interface by the computing device 100 of FIG. 1 for read and write operations on the NVRAM, in accordance with the principles of the disclosure herein.

FIG. 2 schematically shows another application programming interface (e.g., NVRAM API 162), which may be used by computing device 100 for read and write operations on NVRAM 122, in accordance with the principles of the present disclosure. Various implementations of API 162 may involve corresponding software and/or hardware configurations or reconfigurations of processor 110, CPU 112, I/O controller 160, and/or NVRAM device controller 123/NVRAM 122.

Like the traditional interface between I/O controller 160 and a peripheral device, API 162 may involve setting up of command queues by the CPU (e.g., CPU 112). However, the command queues in the case of API 162 may be set up inside NVRAM device controller 123 (proximate to NVRAM 122) instead of being set up in main memory (e.g., DRAM 124) of computing device 100. Further, in the case of API 162, a single memory buffer (e.g., main memory buffer 164) may be specified per command and each command (e.g., "load x" 114 and "read y" 116) for NVRAM 122 operation may be configured to operate on its corresponding single memory buffer (e.g., memory buffer 164) instead of a scatter-gather list of memory buffers used in the case of the traditional interface. The size of individual transactions (e.g., read or write segments, blocks or pages) may be limited by a maximum size of memory buffer 164 that may be allocated by the computer system (e.g., computing device 100). In modern computer systems, the maximum size of memory buffer 164 may, for example, be a single page of memory (typically 4 KB), which is used in virtual memory in the modern computer systems.

In an example implementation of API 162, the bit size of a CPU command for read or write operations on NVRAM 122 via API 162 may be limited to the maximum size of a write operation that a single machine instruction can cause the CPU 112 to issue. For example, in many modern computer systems, the maximum size of such a single-machine-instruction write operation command may be 64 bits. Such a bit-size limited command may advantageously travel through computing device 100 as a single bus transaction. Further, limiting the bit-sizes of the CPU commands for read or write operations on NVRAM 122 in this manner (i.e. to the size of a single machine instruction) may ensure that multiple commands are enqueued atomically in the command queues that may be set up inside NVRAM device controller 123 proximate to NVRAM 122). Such atomically enqueued multiple commands (e.g., for write operations on NVRAM 122) may be executed without the use of locking operations (which are often necessary, for example, when a write command spans more than one machine instruction).

In another example implementation of API 162, the CPU commands for read or write operations on NVRAM 122 via API 162 may not be limited in size (i.e. the commands may be larger than the write size of a single machine instruction). In such an implementation (having the larger allowed command size), the command queues that may be set up inside NVRAM device controller 123 may be segregated by execution thread and include separate command queues for each execution thread accessing NVRAM 122. Such an implementation of API 162 may also avoid the need for locking operations in executing commands accessing NVRAM 122, however, at the cost of increased use of resources in NVRAM device controller 123 and weakening of ordering guarantees.

In example implementations of computing device 100, the command queues that may be set up inside NVRAM device controller 123 may occupy a certain address range in the host Memory Mapped Input Output (MMIO) space. When the host processor (e.g., processor 110) sends a read or write command to NVRAM device controller 123, processor 110 may use a CPU store instruction to write or place the command in a command queue at a certain address in the range of memory addresses reserved for the queue in MMIO space. Memory controller 140 working in conjunction with I/O controller 160 may transfer the command over I/O bus 150 to the NVRAM device controller 123.

In various implementations of computing device 100, the range of memory addresses reserved for the command queue in MMIO space may be as small as the size of a single machine word, as large as the maximum size of all the commands the queue can hold, or arbitrarily large.

In one example implementation, the address range reserved in MMIO space for the command queue may be a single machine word (e.g., 64 bits). Accordingly, the address range for the command queue may be 64 bits, and each command may be 64 bits long. In this implementation, the host processor (e.g., processor 110) may write successive commands to the same address in the queue. NVRAM device controller 123 may maintain the successive commands separately in its internal storage, execute them all one-by-one in some order, and send the results back to the host processor. As an example, NVRAM device controller 123 may maintain the successive commands in an internal queue to dispatch them to the NVRAM in firstinfirstout (FIFO) order. The host processor and NVRAM device controller 123 may be configured to coordinate operations to manage the internal queue. The coordinated operations may, for example, provide the host processor with an indication of how many new commands can be sent to NVRAM device controller 123 to be included in its internal storage or queue. In the case where NVRAM device controller 123 maintains the commands internally in a FIFO queue, the host processor and NVRAM device controller 123 may, for example, be configured to exchange or use a head and tail pointer to manage the queue.

In another example implementation, the address range reserved in MMIO space for the command queue may be the maximum size of the commands that the queue can hold at any one time. In an example scenario, for a command queue designed to hold up to a maximum of 1024 64-bit size commands, the address range reserved in MMIO space may be 1024 64 bit words. In this implementation, the host processor (e.g., processor 110) may write up to 1024 successive commands at successive addresses in the queue, for example, in a round robin fashion. After the end of the range has been reached, the host processor may start again at the beginning of the queue address range. NVRAM device controller 123 may execute the commands in the queue in some order, send the results back to the host processor, and indicate to the host processor how many new commands can subsequently be added to the queue (e.g., by maintaining a head and tail pointer between the host processor and the NVRAM device controller 123 to manage the queue). In this implementation, since the queue is in MMIO space, NVRAM device controller 123 may not need any explicit notification that a new command has been added to the queue by the host processor. Writing the command in the queue in MMIO space may itself serve as implicit notification to NVRAM device controller 123 that the command has been added to the queue. This manner of implicit notification in the foregoing implementation (in which the address range for the command queue reserved in MMIO space is the maximum size of the commands that the queue can hold at any one time) may be contrasted with explicit notification required in the case in which the command queue is maintained in host DRAM (e.g., DRAM 124). In current standard practice, when the command queue is maintained in host DRAM, the host processor may be required to write a queue tail pointer into MMIO space to explicitly indicate to NVRAM device controller 123 that a new command has been added to the queue. The method described herein may eliminate the need for this explicit notification.

Further, in the foregoing implementation, having sufficient reserved address range in MMIO space to accommodate several commands in the command queue may permit beneficial use of write combining techniques, for example, to improve the performance of the command writes to NVRAM device controller 123 through I/O controller 160.

In yet another example implementation, the address range reserved in MMIO space for the command queue may have an arbitrary size. Any command written by the host processor in the reserved address range may be accepted by NVRAM device controller 123 and held in its internal storage to be executed in some order. The actual command address within the reserved address range may be exploited to transmit additional bits of information with the command. In an example scenario, each command may be 64 bits long and the address range reserved in MMIO space for the command queue may, for example, be 16 64-bit words (e.g., word 0, word 1, . . . , and word 15). The host processor may write a 64-bit command to any of the 16 words. The address of the word used to write the command may associate or indicate an additional 4 bits of information with the command. For example, a command written at word 0 may indicate the additional bits 0000, a command written at word 5 may indicate the additional bits 0101, and a command written at word 13 may indicate the additional bits 1101, and so on. By using the word address in this manner to convey additional information, a 64 bit command may be effectively extended to carry the same information as a 68 bit command.

Figure 3:
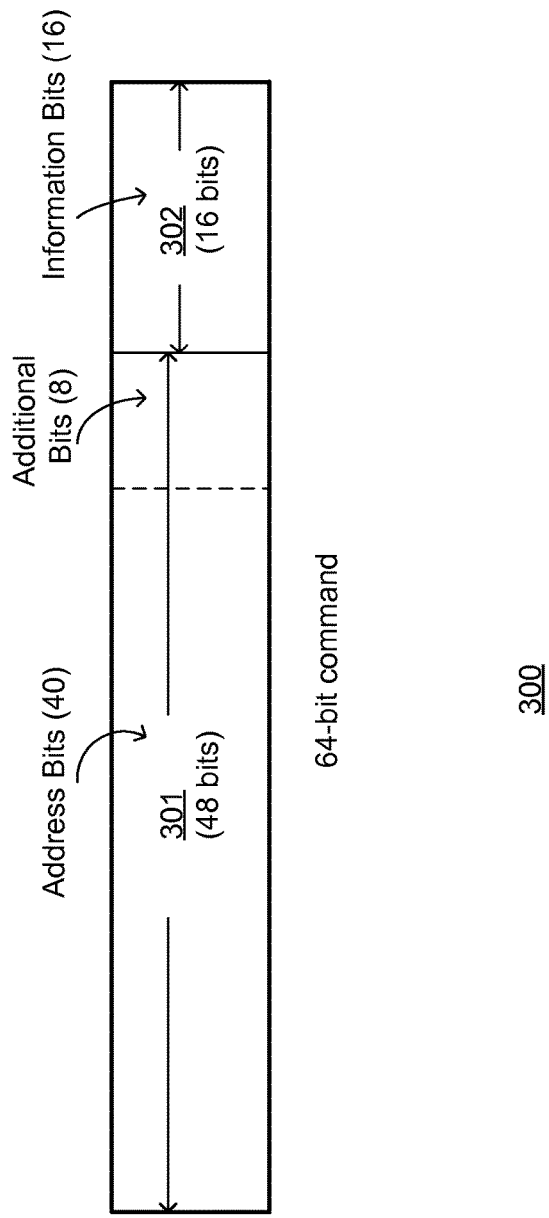
FIG. 3 is a schematic block diagram illustration of an example command structure of a 64-bit size command for read or write operations on NVRAM, in accordance with the principles of the present disclosure.

FIG. 3 schematically shows an example command structure 300 of a 64-bit size command for read or write operations on NVRAM 122 via API 162, in accordance with the principles of the present disclosure.

Command structure 300 may include an address-bits field 301 reserved to carry NVRAM address bits and an information-bits field 302 designated to carry the remaining content or information of a command. In an example implementation of command structure 300, address-bits field 301 may be 48 bits long and information-bits field 302 may be 16 bits long. Depending on the size of the NVRAM (e.g., NVRAM 122) and the granularity of access required, all or a subset of the 48 bits of address-bits field 301 may be used as NVRAM address bits. In an example case, properly addressing terabytes of memory packed in a single device (e.g., NVRAM 122) may, for example, require addresses of up to 40 bits long. In such case, a 40-bit subset of the 48 bits long address-bits field 301 may be used to carry the NVRAM address bits of the command.

In example implementations of API 162, the information content of a command carried in the 16 information bits (e.g., information-bits field 303) in command structure 300 may be increased or amplified by using one or more of these 16 information bits to link or point to additional information stored in one or more pre-initialized registers in NVRAM device controller 123. The pre-initialized registers may, for example store information that does not change frequently. Processor 110 may be configured to initialize the one or more pre-initialized registers with pre-stored information and periodically update the pre-stored information in the pre-initialized registers. For example, memory buffer 164, which is the single specified buffer where data read from NVRAM 122 is returned, may be pre-allocated by processor 110 and its address written to a pre-initialized register in advance of an actual 64-bit read command to NVRAM 122. The actual command can then merely reference the pre-initialized register (e.g., by pre-initialized register number) in information-bits field 303 of command structure 300 to provide information on the address of memory buffer 164.

Typically, several such pre-initialized registers may be provided for each execution thread. The pre-initialized registers may be numbered and identified by number. Only a small field may be needed within command structure 300 to unambiguously reference or point to a pre-initialized register. For example, in the case where there are 1024 such pre-initialized registers, a 10 bit field may be required to unambiguously identify any of the 1024 pre-initialized registers.

After NVRAM 122 has completed a command operation, NVRAM 122/NVRAM device controller 123 may provide a completion indication to the host (e.g., processor 110/I/O controller 160). For read commands that return a fraction of a cacheline, the completion indication may be included in the same buffer (e.g., memory buffer 164) that returns the read data. Writing an entire cacheline may be just as efficient as or even more efficient than writing a portion of the cacheline. Accordingly, for efficiency, when the read data does not fill a whole cacheline, the completion indication may be added to the cache line and any unfilled portions of the cacheline padded may be with zeros. For read commands that fill one or more cache lines in their entireties and for write or store commands that do not return any data, a different mechanism may be used to provide a completion indication to the host. This mechanism may, for example, consist of single bit flags in main memory that are separate from the buffers used for data. Multiple such flags may be packed into a single cacheline.

In the case where bit flags are used to indicate completion, the host processor should be able to identify which command a received completion bit corresponds to. This correspondence or association of the command and the completion bit may be established by the information bits in the command. In an example implementation, the information bits in the command that select the I/O buffer may at the same time select the completion bit associated with the command.

Figure 4:
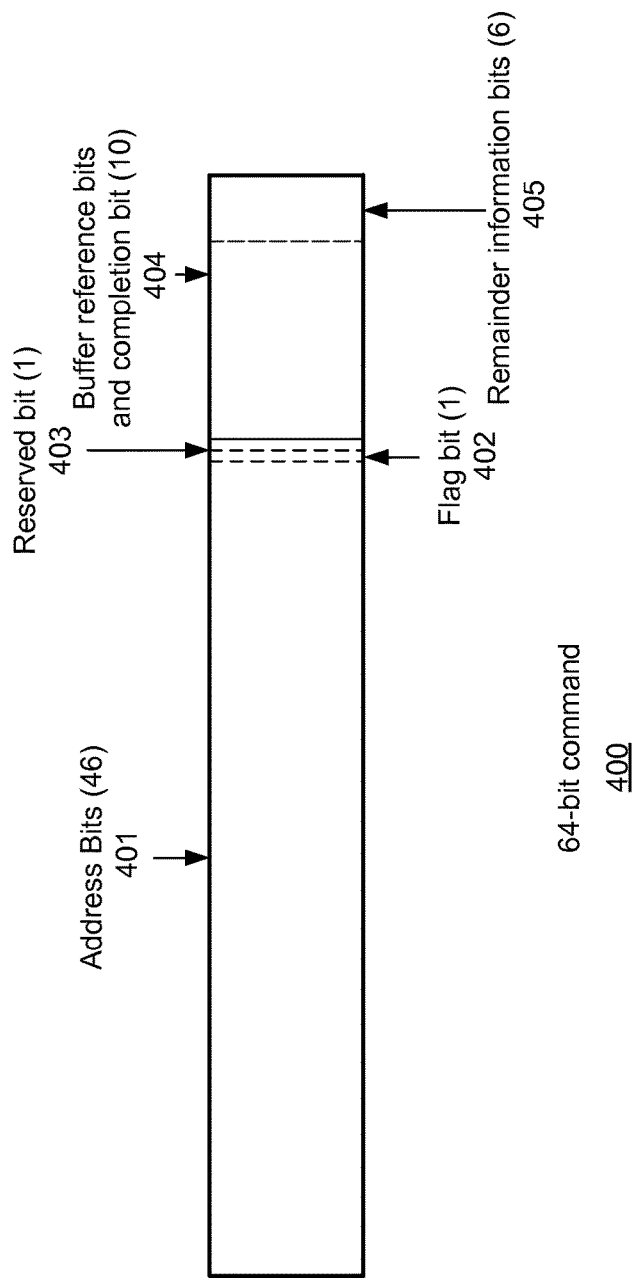
FIG. 4 is a schematic block diagram illustration of another example command structure of a 64-bit size command for read or write operations on NVRAM, in accordance with the principles of the present disclosure.

FIG. 4 schematically shows another example command structure 400 of a 64-bit size command for read or write operations on NVRAM 122 via API 162, in accordance with the principles of the present disclosure. Command structure 400 may include bit-fields that are similar to address-bits field 301 and information-bits field 302 of example command structure 300 (FIG. 3). Command structure 400 may, for example, include a 46-bit address-bits field 401 for an address of the NVRAM, a 1-bit flag field 402 for a flag or completion request bit to indicate that completion notification is required, a 1-bit reserve field 403, a 10-bit register index field 404 to identify the data buffer (e.g., memory buffer 164) for returning the read data and to identify the completion bit, and a 6-bit remainder information field 405 for the remainder content or information of a command. The remainder information field 405 may, for example, specify the size of the data transfer.

In another example implementation of API 162, the CPU commands for read or write operations on NVRAM 122 via API 162 may not be limited in size (i.e. the commands may be larger in size than a single machine instruction, e.g., 64 bits). In such an implementation (having the larger allowed command size), the command queues that may be set up inside NVRAM device controller 123 may segregated by execution threads and include separate command queues for each execution thread accessing NVRAM 122. Such an implementation of API 162 may also avoid the need for locking operations, however, at the cost of increased use of resources in NVRAM device controller 123 and weakening of ordering guarantees.

Figure 5:
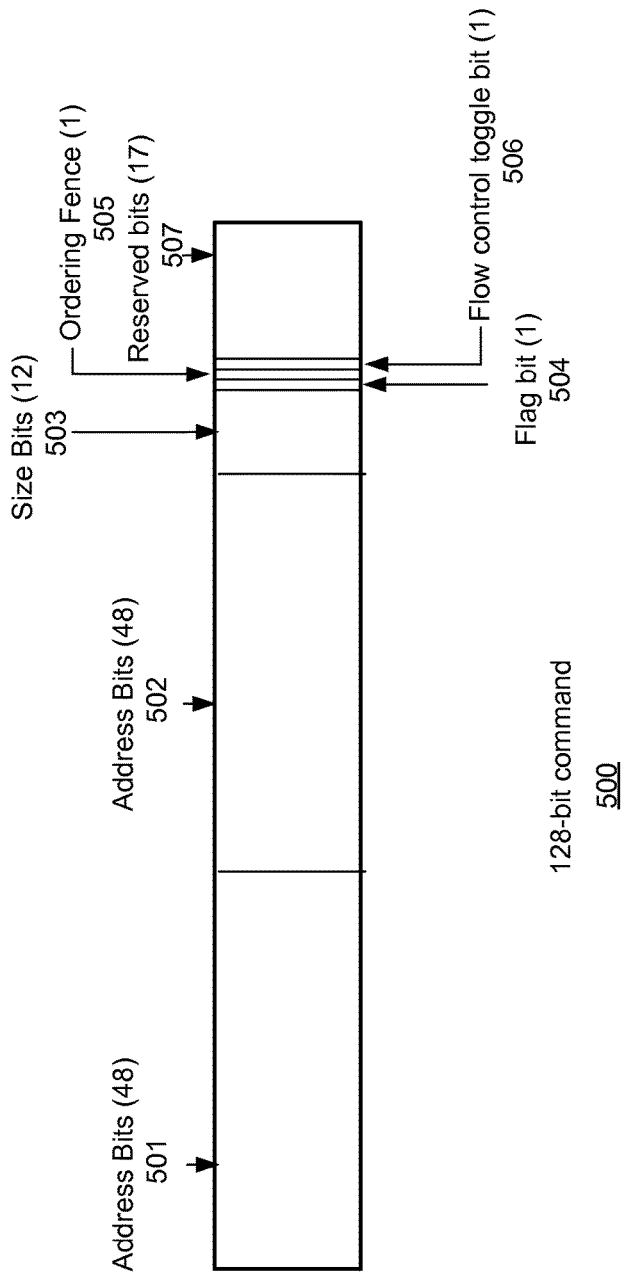
FIG. 5 is a schematic block diagram illustration of an example command structure, which is larger than a single 64-bit machine instruction, for read or write operations on NVRAM, in accordance with the principles of the present disclosure.

FIG. 5 schematically shows an example command structure 500, which is larger than a single 64-bit machine instruction, for read or write operations on NVRAM 122 via API 162, in accordance with the principles of the present disclosure. Command structure 500 may, for example, have a 128-bit size for a read command for reading data from NVRAM 122 and returning the read data, for example, to a buffer in DRAM 124. Command structure 500 for the read command may, for example, include a 48 bit address-bits field 501 for an address of the NVRAM portion to be read, another 48 bit address-bits field 502 for the address of the DRAM buffer where read data is to be returned, a 12 bit size field 503, 1 bit flag field 504 for a flag or completion request bit to indicate that completion notification is required, a 1 bit ordering fence field 505, an optional 1 bit flow control toggle bit field 506, and a 17 bit reserved-bits field 507. It will be understood that a 128-bit command based on example command structure 500 may split into parts (e.g., two 64 bit writes) and enqueued atomically part-by-part in 64-bit units in the command queues for execution.

An ordering bit (set, for example, in ordering fence field 505) may be used to indicate an order in which the enqueued commands should be completed. Different ordering semantics may be indicated by the ordering bit. For example, the ordering bit may indicate that all previously enqueued commands must be completed before the command with the ordering bit set is executed, or that in addition all subsequent commands must wait to begin until after the command with the ordering bit set is executed, or other similar ordering of commands around the command with the ordering bit set.

The ordering bit may be used in conjunction with the completion bit to reduce the overhead of sending completion notifications for each command in a command queue. Each completion notification may require a DMA operation transferring completion information from NVRAM device controller 123 to the host processor (e.g., processor 110). To reduce the number of DMA operations required for completion notifications for the commands in a command queue, the host processor may clear the completion bits on a number of individual commands to skip or avoid the DMA operations required for transferring individual completion notifications for those commands. However, the host processor (e.g., processor 110) may still need to know when the commands are complete for one or more purposes (e.g., for flow control, for passing completion information on up to higher layers of host software, etc.). Without receiving all the individual completion notifications, the host processor may derive information on when the commands are complete, for example, by using the ordering bit in conjunction with the completion bit. For example, a completion notification for a command for which both the ordering bit and the completion bit are set may indicate to the host processor that all prior commands before the command with the ordering bit set have been completed.

With renewed reference to FIGS. 1 and 2, the host processor (e.g., processor 110) may issue commands (e.g., "read (x) 114", "write (y) 116" etc.) to NVRAM device controller 123, which in response may send completion notifications back to the host processor if the commands have the completion bits set. A method by which NVRAM device controller 123 may recognize that a new command has been issued may involve the host processor writing the command explicitly into the MMIO space of NVRAM device controller 123. NVRAM device controller 123 may see the explicit write in the MMIO space and begin processing the command. A method by which the host controller may recognize that NVRAM device controller 123 has issued a command completion notification may involve the host processor polling the buffer (e.g., memory buffer 164) or polling the completion bits. The host controller may read the completion bits repeatedly while waiting for a completion bit to change as indication that the command has completed. By the foregoing methods involving explicit writes of commands or polling of completion bits, the host processor and NVRAM device controller may be notified of commands and completions.

Further, in computing device 100, a method of flow control may be implemented so the host processor (e.g., processor 110) does not issue or write more commands than NVRAM device controller 123 can process at one time, and, conversely, so that NVRAM device controller 123 does not send more responses than the host processor can process at one time.

An example method for flow control of commands and responses may involve using an index in the information fields of the commands (e.g., in information field 302 of command structure 300, etc.) to limit the number of commands and responses being processed at a time. The index may, for example, be the index which selects the buffer for the command. Only a limited number of indices may be available in the information fields of the commands. NVRAM device controller 123 may be configured to simultaneously of concurrently process as many commands as there are indices. To implement flow control to limit the number of commands and responses being processed at a time, the host processor may be configured not to reuse an index in a command until the previous command with that index has completed and the completion has been processed by the host processor.

Another example method of flow control to limit the number of commands and responses being processed at a time may involve NVRAM device controller 123 maintaining a circular FIFO queue of commands with head and tail pointers into this queue maintained by both the host processor and NVRAM device controller 123. In this method, when the host processor sends a new command, it may increment its tail pointer to indicate that the new command has been added at the tail of the queue. Conversely, when NVRAM device controller 123 removes a command from the queue for processing, it may increment its head pointer to indicate that a command has been removed from the head of the queue. NVRAM device controller 123 may be configured to communicate its head pointer values to the host processor periodically or at certain times. The host processor may be configured use the head pointer values to compute how much space is available in the queue to send new commands.

In an example implementation, NVRAM device controller 123 may transfer its head pointer to the host processor via DMA channels. This DMA transfer of the head pointer may be combined with the DMA transfer of completion bits for efficiency. In various configurations of computing device 100, NVRAM device controller 123 may variously conduct the DMA transfer of the head pointer periodically, delay the DMA transfer of the head pointer until a certain number of commands have been processed, conduct the DMA transfer the head pointer each time there is a DMA transfer of completion bits, or may combine these techniques or use other techniques to decide when to conduct a DMA transfer of the head pointer back to the host processor.

Further, the host processor may control timing of the DMA transfer of the head pointer from NVRAM device controller 123, for example, by setting a completion request bit in a command to request that NVRAM device controller 123 send an update of the head pointer. Flow control of DMA transfers of the head pointer may be accomplished by using, for example, the previously described method for flow control of commands and responses involving use of an index in the information fields of the commands, or other methods.

FIG. 6 shows an example method 600 for deploying and managing NVRAM (e.g., NVRAM 122) coupled to a processor or CPU core of a computing device, in accordance with the principles of the disclosure herein. In particular, method 600 may relate to mitigating or managing effects on system performance of the NVRAM load and store access times that are slower than DRAM load and store access times.

Method 600 may include providing NVRAM as memory modules (e.g., dual-in-line memory modules (DIMMs)) coupled to the CPU core of the computing device as a peripheral device via an I/O bus (610), and providing a NVRAM application programming interface (API) for the processor or CPU core to conduct NVRAM read and write operations (620).

Method 600 may further include allocating a single memory buffer per command, for example, in DRAM (120), to hold data transferred to or from the NVRAM via the API (621). In method 600, the size of individual data transfer transactions may be limited to the maximum size memory buffer that the computing device can allocate. The maximum size may, for example, be a single page of memory used by the virtual memory system (e.g., 4 KB) of the computing device.

In an example implementation, method 600 may also include limiting the bit-size of commands for read or write operations on the NVRAM via API 162 (622). The bit size of the commands may, for example, be limited to the size of a single machine instruction (e.g., 64 bits, etc.) that can be issued by the CPU (623). Limiting the bit size of a command 623 may include providing a command structure that includes an address-bits field and an information-bits field (624). For a 64-bit size command, the command structure may include only a small number of bits (e.g., 16 bits) in the information-bits field of the command.

Method 600 may include amplifying or augmenting the information content of a bit-size limited command by using the information bits carried in the information-bits field of the command to link or point to one or more pre-initialized registers, which store additional information (625). The pre-initialized registers may, for example store information that does not change frequently. An example pre-initialized register may store the address of the single memory buffer allocated to hold data transferred to or from the NVRAM via the API. An actual command can merely reference the pre-initialized register (e.g., by pre-initialized register number) in the information-bits field of bit-size limited command to convey information on the address of memory buffer.

Method 600 may additionally include providing a bit in the command structure to indicate that the NVRAM should provide a completion indication to the host (e.g., processor 110/NVRAM device controller 123) (626).

In an example implementation, method 600 may include providing a 64-bit command structure for use with the NVRAM, which, for example, includes a 46 bit address of the NVRAM memory being read, a 1 bit flag or completion request to indicate that completion notification is required, a 10 bit index to select the data buffer (for returning the data), a 6 bit size field, and 1 reserved bit.

In another example implementation, method 600 may include providing a 128-bit command structure for use with the NVRAM. The 128-bit command structure may, for example, include a 48 bit address of the NVRAM memory being read, a 48 bit address of the DRAM buffer where data is returned, a 12 bit size field, a 1 bit flag to indicate that completion notification is required, a 1 bit ordering fence, al bit flow control toggle bit and 17 reserved bits.

A computer system (e.g., computing device 100) may be deployed to implement method 600 in conjunction with a non-transitory computer-readable storage medium having instructions stored thereon. The instructions when executed by one or more microprocessors may cause the computer system to implement method 600 as described in the foregoing with reference to FIG. 6.

Figure 7:
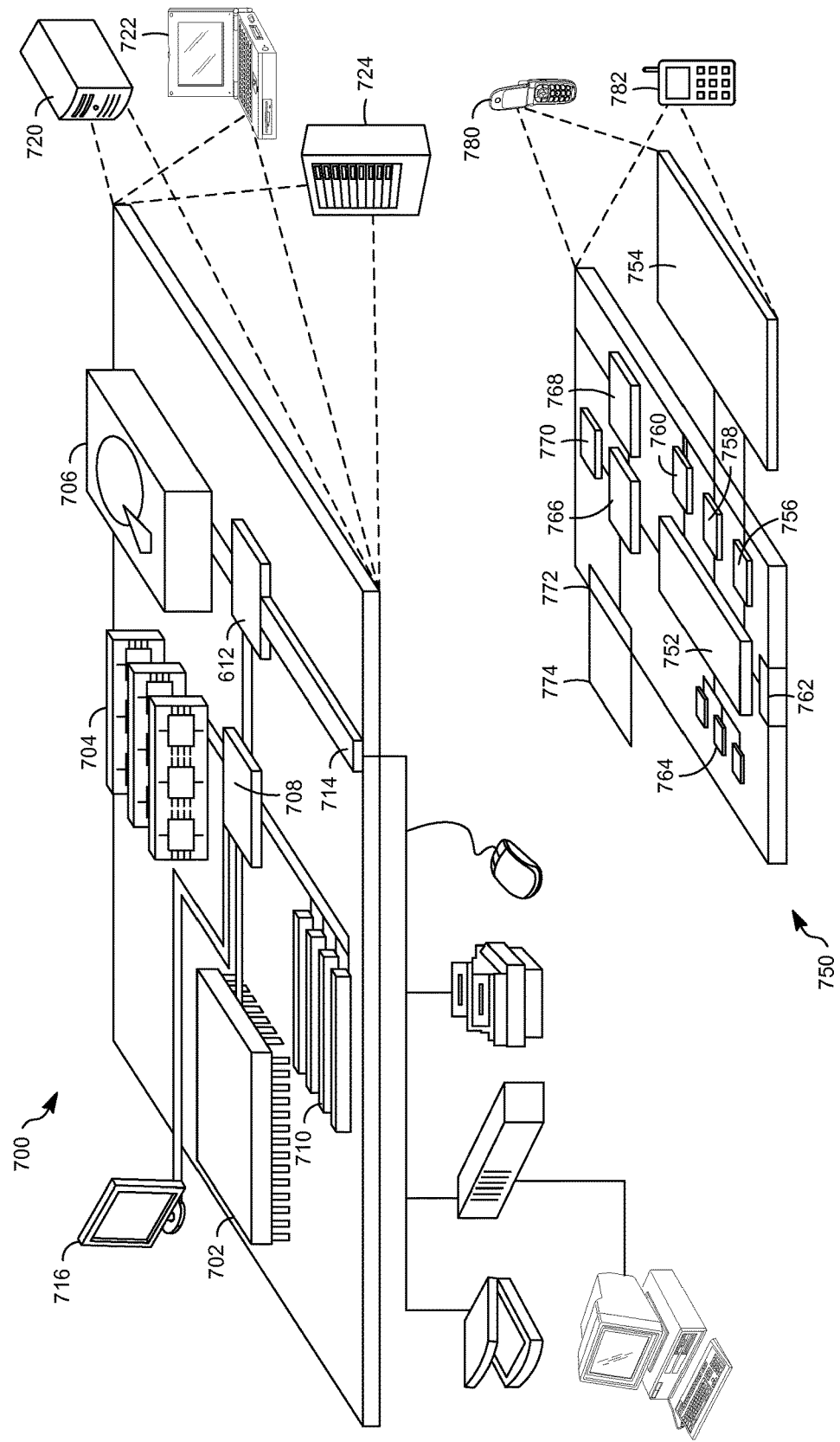
FIG. 7 illustrates an example of a computer device and a mobile computer device that can be used to implement the techniques described here.

FIG. 7 shows an example of a generic computer device 700 and a generic mobile computer device 750, which may be used with the techniques described here. Computing device 700 is intended to represent various forms of digital computers, such as laptops, desktops, workstations, personal digital assistants, servers, blade servers, mainframes, and other appropriate computers. Computing device 750 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 700 includes a processor 702, a memory 704, a storage device 706, a high-speed interface 708 connecting to memory 704 and high-speed expansion ports 710, and a low speed interface 712 connecting to low speed bus 714 and storage device 706. Each of the components 702, 704, 706, 708, 710, and 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as display 716 coupled to high speed interface 708. In other implementations, multiple processors and/or multiple buses may be used, as appropriate, along with multiple memories and types of memory. Also, multiple computing devices 700 may be connected, with each device providing portions of the necessary operations (e.g., as a server bank, a group of blade servers, or a multi-processor system).

The memory 704 stores information within the computing device 700. In one implementation, the memory 704 is a volatile memory unit or units. In another implementation, the memory 704 is a non-volatile memory unit or units. The memory 704 may also be another form of computer-readable medium, such as a magnetic or optical disk.

The storage device 706 is capable of providing mass storage for the computing device 700. In one implementation, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 704, the storage device 706, or memory on processor 702.

The high speed controller 708 manages bandwidth-intensive operations for the computing device 700, while the low speed controller 712 manages lower bandwidth-intensive operations. Such allocation of functions is exemplary only. In one implementation, the high-speed controller 708 is coupled to memory 704, display 716 (e.g., through a graphics processor or accelerator), and to high-speed expansion ports 710, which may accept various expansion cards (not shown). In the implementation, low-speed controller 712 is coupled to storage device 706 and low-speed expansion port 714. The low-speed expansion port, which may include various communication ports (e.g., USB, BLUETOOTH, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. It may also be implemented as part of a rack server system 724. In addition, it may be implemented in a personal computer such as a laptop computer 722. Alternatively, components from computing device 700 may be combined with other components in a mobile device (not shown), such as device 750. Each of such devices may contain one or more of computing device 700, 750, and an entire system may be made up of multiple computing devices 700, 750 communicating with each other.

Computing device 750 includes a processor 752, memory 764, an input/output device such as a display 754, a communication interface 766, and a transceiver 768, among other components. The device 750 may also be provided with a storage device, such as a microdrive or other device, to provide additional storage. Each of the components 750, 752, 764, 754, 766, and 768, are interconnected using various buses, and several of the components may be mounted on a common motherboard or in other manners as appropriate.

The processor 752 can execute instructions within the computing device 750, including instructions stored in the memory 764. The processor may be implemented as a chipset of chips that include separate and multiple analog and digital processors. The processor may provide, for example, for coordination of the other components of the device 750, such as control of user interfaces, applications run by device 750, and wireless communication by device 750.

Processor 752 may communicate with a user through control interface 758 and display interface 756 coupled to a display 754. The display 754 may be, for example, a TFT LCD (Thin-Film-Transistor Liquid Crystal Display) or an OLED (Organic Light Emitting Diode) display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may be provide in communication with processor 752, so as to enable near area communication of device 750 with other devices. External interface 762 may provide, for example, for wired communication in some implementations, or for wireless communication in other implementations, and multiple interfaces may also be used.

The memory 764 stores information within the computing device 750. The memory 764 can be implemented as one or more of a computer-readable medium or media, a volatile memory unit or units, or a non-volatile memory unit or units. Expansion memory 774 may also be provided and connected to device 750 through expansion interface 772, which may include, for example, a SIMM (Single In Line Memory Module) card interface. Such expansion memory 774 may provide extra storage space for device 750, or may also store applications or other information for device 750. Specifically, expansion memory 774 may include instructions to carry out or supplement the processes described above, and may also include secure information also. Thus, for example, expansion memory 774 may be provide as a security module for device 750, and may be programmed with instructions that permit secure use of device 750. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 764, expansion memory 774, or memory on processor 752 that may be received, for example, over transceiver 768 or external interface 762.

Device 750 may communicate wirelessly through communication interface 766, which may include digital signal processing circuitry where necessary. Communication interface 766 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 768. In addition, short-range communication may occur, such as using a Bluetooth, Wi-Fi, or other such transceiver (not shown). In addition, GPS (Global Positioning System) receiver module 770 may provide additional navigation- and location-related wireless data to device 750, which may be used as appropriate by applications running on device 750.

Device 750 may also communicate audibly using audio codec 760, which may receive spoken information from a user and convert it to usable digital information. Audio codec 760 may likewise generate audible sound for a user, such as through a speaker, e.g., in a handset of device 750. Such sound may include sound from voice telephone calls, may include recorded sound (e.g., voice messages, music files, etc.) and may also include sound generated by applications operating on device 750.

The computing device 750 may be implemented in a number of different forms, as shown in the figure. For example, it may be implemented as a cellular telephone 750.

It may also be implemented as part of a smart phone 752, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" or "computer-readable medium" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of implementations have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method comprising:
    providing non-volatile random access memory (NVRAM) coupled to a processor or central processing unit (CPU) core of a computing device as a peripheral device via an input/output (I/O) bus, the NVRAM including a NVRAM controller; and
    providing a NVRAM application programming interface (API) for the CPU core to conduct NVRAM read and write operations, wherein providing the NVRAM API includes allocating to each NVRAM read or write command issued by the CPU core a respective single memory buffer, wherein a bit size of each NVRAM read or write command is limited to the size of a single machine instruction that can be issued by the CPU core, and constraining the each NVRAM read or write command to operate only on the respective single memory buffer to the hold data transferred to or from the NVRAM,
    wherein the respective single memory buffer is made of contiguous units of memory, and has a single memory address for addressing, by the each NVRAM read or write command, the held data transferred to or from the NVRAM in the respective memory single buffer, and
    wherein the one or more CPUs in conjunction with the NVRAM API are configured to set up queue tail pointer-less command queues inside a reserved area in the computing device's main memory mapped I/O (MMIO) space with each command write in the MMIO space being unaccompanied by writing of a queue tail pointer by the one or more CPUs, the writing of each command write in the MMIO space by the one or more CPUs implicitly notifying the NVRAM controller that there is a new command for the NVRAM controller to execute on the NVRAM.

2. The method of claim 1, wherein allocating the respective single memory buffer includes allocating the respective single memory buffer in a main memory portion of the computing device coupled to the processor or CPU core.

3. The method of claim 1 further comprising reserving an area in the computing device's main memory mapped I/O (MMIO) space for the processor or CPU core to write commands to the NVRAM controller, the size of reserved area being one of: the size of a single command, or the size of a full queue of commands to be processed by the NVRAM controller.

4. The method of claim 3 further comprising writing, by the processor or CPU core, a new command into the reserved area of the MMIO space, the writing serving as a notification to the NVRAM controller that the new command has been sent to be included in a set of one or more commands written in the reserved area.

5. The method of claim 3 further comprising maintaining, by the NVRAM controller, an order of commands as written in the reserved area of the MMIO space regardless of the particular addresses used by the processor or CPU core to write the commands in the MMIO space, wherein the maintaining includes maintaining a first-in-first-out queue of commands or maintaining an ordered data structure of the commands written in the reserved area of the MMIO space.

6. The method of claim 3 further comprising:
writing, by the processor or CPU core, a sequence of commands into the reserved area of the MMIO space; and
write-combining two of more of the sequence of commands for transfer over the I/O bus to the NVRAM controller.

7. The method of claim 1, wherein providing the NVRAM API includes limiting a bit-size of commands for read or write operations on the NVRAM via the API to the size of data that can be written by a single machine store instruction issued by the CPU core.

8. The method of claim 7 further comprising using the address bits of a bit-size limited command written to an address in the MMIO space as extra bits to extend the bit size of the command.

9. The method of claim 7, wherein providing the NVRAM API includes providing a command structure that includes an address-bits field and an information-bits field.

10. The method of claim 9, wherein providing the NVRAM API includes amplifying an information content of a bit-size limited command by using the information bits carried in the information-bits field to link to one or more pre-initialized registers that store additional information.

11. The method of claim 9 further comprising using, by the processor or CPU core, an index bit in the information-bits field of a particular command to select the respective single memory buffer used by that particular command to hold data transferred to or from the NVRAM or to indicate the location of completion information for that particular command.

12. The method of claim 9 further comprising setting, by the processor or CPU core, a completion notification request bit in the information-bits field of a particular command to indicate that the NVRAM controller should return a completion notification when the particular command is completed.

13. The method of claim 9 further comprising setting, by the processor or CPU core, ordering bit in the information-bits field of a particular command to indicate that the NVRAM controller should ensure that execution of other commands are ordered with respect to execution the particular command having the ordering bit set.

14. The method of claim 13 further comprising using, by the processor or CPU core, a completion notification returned from the NVRAM controller for the particular command having the ordering bit set as an indication that commands written prior to the particular command have been completed.

15. The method of claim 13, wherein the NVRAM controller maintains the commands written in the reserved area of the MMIO space in a first-in-first-out (FIFO) queue, the method further comprising periodically returning, by the NVRAM controller, the head pointer in FIFO queue back to the processor or CPU core using a direct memory access (DMA) operation.

16. The method of claim 15 further comprising returning, by the NVRAM controller, command completion information in the same DMA operation that returns the head pointer in FIFO queue back to the processor or CPU core.

17. The method of claim 16 further comprising initiating, by the NVRAM controller, the DMA operation that returns the command completion information and the head pointer in response to the processor or CPU core setting a completion notification request bit in the command.

18. The method of claim 7, wherein providing the NVRAM API includes providing a bit in the command structure to indicate that the NVRAM should provide a command completion indication.

19. The method of claim 1, wherein providing NVRAM coupled to the processor or CPU core of the computing device as a peripheral device includes providing the NVRAM as a memory module.

20. The method of claim 19, wherein providing the NVRAM as a memory module includes providing the NVRAM as a dual in-line memory module (DIMM).

21. A computing device comprising:
a processor including one or more central processing units (CPUs), the one or more CPUs coupled to a memory arrangement on a memory bus via a memory controller, the processor further including an input/output bridge or controller coupled to one or more peripheral devices on an I/O bus;
a non-volatile random access memory (NVRAM) disposed as a peripheral device on the input/output (I/O) bus, the NVRAM including a NVRAM controller; and
a NVRAM application programming interface (API) for the one or more CPUs to issue commands to conduct NVRAM read and write operations over the I/O bus,
wherein the one or more CPUs in conjunction with the NVRAM API are configured to set up queue tail pointer-less command queues inside a reserved area in the computing device's main memory mapped I/O (MMIO) space with each command write in the MMIO space being unaccompanied by writing of a queue tail pointer by the one or more CPUs, the writing of each command write in the MMIO space by the one or more CPUs implicitly notifying the NVRAM controller that there is a new command for the NVRAM controller to execute on the NVRAM.

22. The computing device of claim 21,
wherein the NVRAM API is configured to use a respective single memory buffer, for each NVRAM read or write command issued by the one or more CPUs, to hold data transferred to or from the NVRAM,
wherein a bit size of each NVRAM read or write command is limited to the size of a single machine instruction that can be issued by the CPU core, and
wherein the respective single memory buffer is made of contiguous units of memory, and has a single memory address for addressing, by the each read or write command issued by the one or more CPUs, the held data transferred to or from the NVRAM in the respective single memory buffer.

23. The computing device of claim 22, wherein the respective single memory buffer is disposed in a main memory portion of the computing device.

24. The computing device of claim 22 further comprising a reserved area in the computing device's main memory mapped I/O (MMIO) space for the one- or more CPUs to write commands to the NVRAM controller, the size of reserved area being one of: the size of a single command, the size of a full queue of commands to be processed by the NVRAM controller, or an arbitrarily large size.

25. The computing device of claim 24, wherein writing, by the one- or more CPUs, a new command into the reserved area of the MMIO space serves as a notification to the NVRAM controller that the new command has been sent to be included in a set of one or more commands written in the reserved area.

26. The computing device of claim 24, wherein the NVRAM controller is configured to maintain an order of commands as written in the reserved area of the MMIO space, regardless of the particular addresses used by the one or more CPUs to write the commands in the MMIO space, by maintaining a first-in-first-out queue of commands or by maintaining an ordered data structure of the commands written in the reserved area of the MMIO space.

27. The computing device of claim 24, wherein the one or more CPUs are configured to write a sequence of commands into the reserved area of the MMIO space and write-combine two of more of the sequence of commands for transfer over the I/O bus to the NVRAM controller.

28. The computing device of claim 24, wherein the NVRAM API is configured to limit a bit-size of commands for read or write operations on the NVRAM via the API to the size of data that can be written by a single machine instruction issued by the one or more CPUs.

29. The computing device of claim 28, wherein the one or more CPUs are configured to use the address bits of a bit-size limited command written to an address in the MMIO space as extra bits to extend the bit size of the command.

30. The computing device of claim 28, wherein commands for read or write operations on the NVRAM via the API are enqueued atomically.

31. The computing device of claim 28, wherein the NVRAM API defines a command structure that includes an address-bits field and an information-bits field.

32. The computing device of claim 31, wherein the NVRAM API is configured to amplify an information content of a bit-size limited command by using the information bits carried in the information-bits field to link to one or more pre-initialized registers that store additional information.

33. The computing device of claim 31, wherein the one or more CPUs are configured to use an index bit in the information-bits field of a particular command to select the respective single memory buffer used by that particular command to hold data transferred to or from the NVRAM or to indicate the location of completion information for that particular command.

34. The computing device of claim 31, wherein the one or more CPUs are configured to use a completion notification request bit in the information-bits field of a particular command to indicate that the NVRAM controller should return a completion notification when the particular command is completed.

35. The computing device of claim 31, wherein the one or more CPUs are configured to set an ordering bit in the information-bits field of a particular command to indicate that the NVRAM controller should ensure that execution of other commands are ordered with respect to execution of the particular command having the ordering bit set.

36. The computing device of claim 31, wherein the one or more CPUs are configured to use a completion notification returned from the NVRAM controller for the particular command having the ordering bit set as an indication that commands written prior to the particular command have been completed.

37. The computing device of claim 31, wherein the NVRAM controller is configured to maintain the commands written in the reserved area of the MMIO space in a first-in-first-out (FIFO) queue, and further configured to periodically return the head pointer in FIFO queue back to the one or more CPUs using a direct memory access (DMA) operation.

38. The computing device of claim 31, wherein the NVRAM controller is configured to return, via a single DMA operation, both command completion information and the head pointer in response to the one or more CPUs setting a completion notification request bit in the command.

39. The computing device of claim 21, wherein the NVRAM API is configured to use, for each command, a single memory buffer disposed in a main memory portion of the computing device to hold data transferred to or from the NVRAM, wherein the single memory buffer is made of contiguous units of memory, and has a single memory address for addressing held data transferred to or from the NVRAM, by the particular command.

40. The computing device of claim 21 wherein the NVRAM API limits a bit-size of commands for read or write operations on the NVRAM via the API to the size of data written by a single machine instruction issued by the one or more CPUs.

41. The computing device of claim 21, wherein commands for read or write operations on the NVRAM via the API are enqueued atomically.

42. The computing device of claim 21, wherein the NVRAM API defines a command structure that includes an address-bits field and an information-bits field, and wherein the NVRAM API enables amplifying an information content of a bit-size limited command by using the information bits carried in the information-bits field to link to one or more pre-initialized registers that store additional information.

* * * * *